US012612305B2

(12) United States Patent
Will et al.

(10) Patent No.: US 12,612,305 B2
(45) Date of Patent: Apr. 28, 2026

(54) METHOD AND DEVICE FOR LOCALLY REMOVING AND/OR MODIFYING A POLYMER MATERIAL ON A SURFACE

(71) Applicant: Robert Bosch GmbH, Stuttgart (DE)

(72) Inventors: Barbara Will, Herrenberg (DE); Juergen Butz, Reutlingen (DE); Ricardo Zamora, Stuttgart (DE); Timo Kuhn, Eningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1050 days.

(21) Appl. No.: 17/641,499

(22) PCT Filed: Jul. 29, 2020

(86) PCT No.: PCT/EP2020/071360
§ 371 (c)(1),
(2) Date: Mar. 9, 2022

(87) PCT Pub. No.: WO2021/052664
PCT Pub. Date: Mar. 25, 2021

(65) Prior Publication Data
US 2022/0306461 A1     Sep. 29, 2022

(30) Foreign Application Priority Data
Sep. 16, 2019     (DE) ..................... 10 2019 214 074.2

(51) Int. Cl.
*B81C 1/00* (2006.01)
*G03F 7/36* (2006.01)
(Continued)

(52) U.S. Cl.
CPC ............ *B81C 1/00476* (2013.01); *G03F 7/36* (2013.01); *G03F 7/40* (2013.01); *G03F 7/427* (2013.01); *B81C 2201/11* (2013.01)

(58) Field of Classification Search
None
See application file for complete search history.

(56) References Cited

U.S. PATENT DOCUMENTS 4,417,948 A     11/1983  Mayne-Banton et al.
4,857,382 A  *  8/1989   Liu ......................... G03F 7/039
                                                     257/E21.256
(Continued)

FOREIGN PATENT DOCUMENTS

CN          1512273 A     7/2004
CN          1530756 A     9/2004
(Continued)

OTHER PUBLICATIONS

Translated Description of Kawasaki (Year: 1998).*
(Continued)

*Primary Examiner* — Jonathan Johnson
*Assistant Examiner* — Andrew Preston Traywick
(74) *Attorney, Agent, or Firm* — NORTON ROSE FULBRIGHT US LLP

(57) ABSTRACT

A method for locally removing/modifying a polymer material on a surface of a wafer. The method includes: a) aligning a mask with respect to the surface; b) locally exposing the surface through the mask using a VUV light source while simultaneously supplying a gas mixture containing at least oxygen; c) purging the surface with a gas mixture containing at least nitrogen and oxygen, the VUV light source being switched off; and d) repeating at least steps b) and c) until the removal/modification is complete. A device is described for locally removing/modifying a polymer material on a surface of a wafer, including a mask. The device includes an adjustable wafer table for holding the wafer, and is configured to set an exposure gap between the wafer and the mask (Continued)

in a first operating state, and to set a purge gap between the wafer and the mask in a second operating state.

12 Claims, 4 Drawing Sheets

(51) Int. Cl.
G03F 7/40      (2006.01)
G03F 7/42      (2006.01)

(56) References Cited

U.S. PATENT DOCUMENTS

| | | | |
|---|---|---|---|
| 5,709,754 A | 1/1998 | Morinville et al. | |
| 6,316,059 B1 | 11/2001 | Van Der Putten et al. | |
| 8,980,751 B2 * | 3/2015 | Schmid | G03F 7/0002 |
| | | | 438/694 |
| 2002/0053353 A1 | 5/2002 | Kawata et al. | |
| 2003/0075524 A1 | 4/2003 | Kawaguchi et al. | |
| 2005/0248744 A1 * | 11/2005 | Shibazaki | G03F 7/70058 |
| | | | 355/75 |
| 2008/0111203 A1 | 5/2008 | Pan et al. | |
| 2010/0314724 A1 | 12/2010 | Hancer | |
| 2012/0229709 A1 | 9/2012 | Heald et al. | |
| 2015/0140827 A1 * | 5/2015 | Kao | H01L 21/76829 |
| | | | 438/704 |
| 2016/0018736 A1 | 1/2016 | Hirose et al. | |
| 2016/0135274 A1 | 5/2016 | Fischer et al. | |
| 2018/0233651 A1 * | 8/2018 | Bang | H10N 30/045 |
| 2019/0086808 A1 | 3/2019 | Nakayama et al. | |

FOREIGN PATENT DOCUMENTS

| | | | |
|---|---|---|---|
| DE | 102004033667 A1 | | 2/2006 |
| DE | 102018210064 A1 | | 12/2019 |
| JP | H10209132 A | * | 8/1998 |
| JP | 2005158796 A | | 6/2005 |
| JP | 2005191166 A | | 7/2005 |
| TW | 201828332 A | | 8/2018 |

OTHER PUBLICATIONS

Gao, et al.: "Fundamentals of Electronic Packaging Processes and Equipment Technology," Electronic Packaging Technology-specialized Core Curriculum Plan Material, Xidian University Press, (2017), p. 126, ISBN 978-7-5606-4463-9.

International Search Report for PCT/EP2020/071360, Issued Nov. 30, 2020.

* cited by examiner

METHOD AND DEVICE FOR LOCALLY REMOVING AND/OR MODIFYING A POLYMER MATERIAL ON A SURFACE

FIELD

The present invention relates to a method for locally removing or also modifying a polymer material on a surface of a wafer. Moreover, the present invention relates to a device for locally removing or also modifying a polymer material on a surface of a wafer.

BACKGROUND INFORMATION

Microelectromechanical system (MEMS) sensors such as acceleration sensors and rotation rate sensors are encapsulated or capped to protect the sensitive movable sensor structure from particles and to provide a molded package for the final product. In addition, operation of the sensor under defined pressure conditions may be enabled via the capping. The capping is achieved by bonding a cap wafer to the sensor wafer. Each of the stated wafers is subjected to a series of technological steps in order to provide the desired sensor structures. Prior to the bonding process, the wafer is coated with an anti-stiction coating that is provided for the movable MEMS structures, and the corresponding bonding frames are produced for each MEMS chip.

The stated anti-stiction coating is a thin polymer layer that is intended to prevent movable sensor structures from adhering in the event of contact with adjacent sensor structures. Prior to the bonding process, the stated anti-stiction coating is applied in a batch process that takes place in a chamber containing multiple wafers, the wafers being coated over their entire surface even though the stated anti-stiction coating is necessary only in local areas on the movable sensor structure.

Surface cleaning to remove organic impurities or polymers with the aid of vacuum ultraviolet (VUV) radiation (having a wavelength between 10 nm and 200 nm) is a conventional process that is used, for example, to remove residues of photoresist during manufacture of flat panel displays (FPDs). The VUV radiation is generated, for example, with a wavelength of 172 nm by an excimer lamp.

The anti-stiction coating at the bonding frame impairs the robustness of the sensor during function tests; a tempering process is therefore presently used to degrade the anti-stiction coating or remove it from the bonding frame. This is possible due to the fact that the thermal stability of the anti-stiction coating is a function of the surface material on which it is deposited.

In the process, the entire wafer is heated, so that the sensor structure, which requires the anti-stiction coating with unchanged properties, is also consequently exposed to the tempering temperature, as the result of which the properties of the anti-stiction coating are altered. It is not technically feasible to precisely locally heat the bonding frame (in the micron range).

A method and a device for local VUV decoating, using a photomask, is described in German Patent Application No. DE 102018210064.0.

SUMMARY

The object of the present invention is to provide a particularly effective method for locally removing or also modifying a polymer material on a surface.

The present invention relates to a method for locally removing or also modifying a polymer material on a surface of a wafer. In accordance with an example embodiment of the present invention, the method includes the steps:

a) aligning a mask with respect to the surface;

b) locally exposing the surface through the mask with the aid of a VUV light source while simultaneously supplying a gas mixture containing at least oxygen (O2);

c) purging the surface with a gas mixture containing at least nitrogen (N2) and/or oxygen (O2), the VUV light source being switched off;

d) repeating at least steps b) and c) until the removal and/or also modification of the polymer material are/is complete.

One advantageous embodiment of the method of the present invention provides that exposure is carried out in step b) with an exposure gap GE between the mask and the surface, and purging is carried out in step c) with a purge gap GP between the mask and the surface, purge gap GP being larger than exposure gap GE. During the purging step, the distance between the wafer and the mask may advantageously be increased, and the polymer that is broken up during the exposure may thus be transported away more effectively by use of the purge gas or purge gas mixture.

One advantageous embodiment of the method of the present invention provides that externally generated ozone (O3) and/or an oxygen radical (O*) are/is supplied in step c). Polymer material that has been broken up by the previous exposure may thus advantageously be removed and transported away.

One advantageous embodiment of the method of the present invention provides that the wafer is in nonparallel alignment with respect to the mask in step c). In this way, during purging the polymer material may be removed or also modified over the entire wafer in a particularly uniform and homogeneous manner.

The method according to the present invention for locally removing or also modifying a polymer material on a surface of a wafer is suitable for replacing tempering, used in the related art, in order to locally remove an anti-stiction coating (ASC) or some other layer made of polymer material from a wafer. The anti-stiction coating may advantageously be removed from a wafer surface in a locally limited manner while other areas of the wafer remain unaffected. Thus, for example, an anti-stiction coating may be removed from the bonding frame of a MEMS wafer while a micromechanical structure, in particular a sensor structure, with an unimpaired anti-stiction coating is retained. The method according to the present invention optimizes the removal of anti-stiction coatings and other layers made of polymer material, with a homogeneous effect over the entire substrate or the entire wafer. The geometric shapes and dimensions of surfaces at which the polymer material remains are well defined with respect to areas where the polymer material is removed, and have a uniform quality over the entire wafer. The method according to the present invention may be adapted to different substrates and different wafer sizes. Further application options of the method according to the present invention are the local photochemical preparation of surfaces to improve subsequent adhesion processes, the homogeneous removal of residues of a photoresist, the local modification of surface loadings, and the cold asking of trench polymers.

Moreover, the present invention relates to a device for locally removing or also modifying a polymer material on a surface of a wafer, including a mask that is alignable with respect to the surface in a defined manner, the surface being exposable with the aid of a VUV light source situated above the mask, a gas mixture containing at least nitrogen (N2) and/or oxygen (O2) being introducible into a space between the wafer and the mask. In accordance with an example embodiment of the present invention, the device includes an adjustable wafer table for holding the wafer, and is configured to set an exposure gap GE between the wafer and the mask in a first operating state, and to set a purge gap between the wafer and the mask in a second operating state, the purge gap being larger than the exposure gap. According to the present invention, VUV decoating that includes successive exposure steps and purging steps may be carried out by use of such a device. A small gap is advantageously selected for the exposure in the first operating state, so that shadowing of the mask on the surface is sharply imaged. A larger gap is advantageously selected for the purging in the second operating state in order to lead sufficient purge gas past the surface of the wafer at the appropriate flow velocity.

One advantageous embodiment of the device according to the present invention provides that the device includes a gas feed for supplying externally generated ozone (O3) or also an oxygen radical (O*). Reactive oxygen for the purging step may thus advantageously be supplied from the outside.

One advantageous embodiment of the device according to the present invention provides that the adjustable wafer table is tiltably designed in such a way that the wafer is alignable with respect to the mask in a nonparallel manner. In this way, the gas flow during the purging step may advantageously be led in such a way that the VUV decoating takes place very homogeneously over the entire wafer surface.

DETAILED DESCRIPTION OF EXAMPLE EMBODIMENTS

Figure 1A:
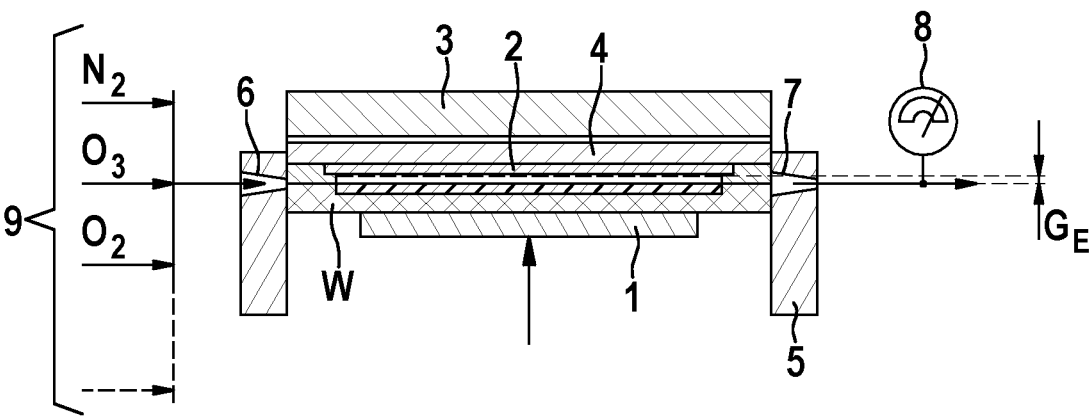
FIGS. 1A and 1B show a device according to an example embodiment of the present invention for locally removing and/or modifying a polymer material on a surface of a wafer.
Figure 1B:
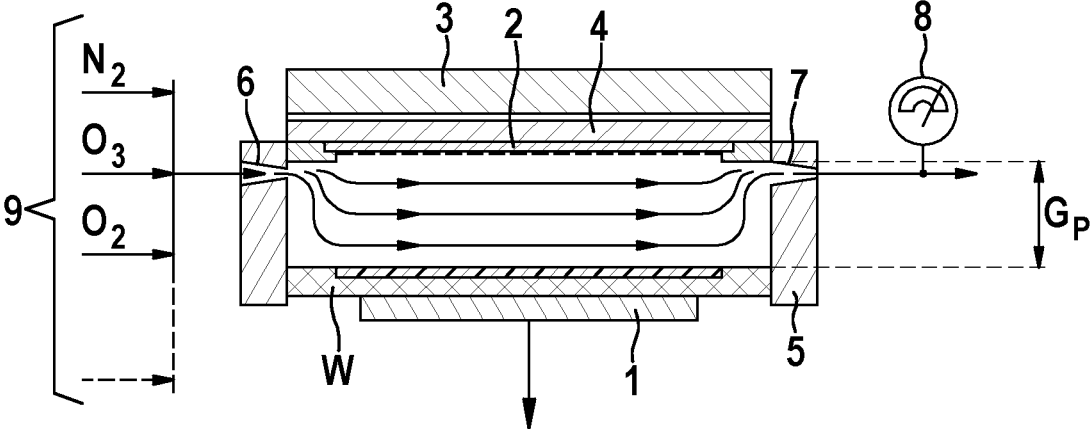

FIGS. 1A and 1B show a device according to the present invention for locally removing and/or modifying a polymer material on a surface of a wafer. The device includes an adjustable wafer table 1, a mask 2, a VUV light source 3, a hermetically sealed reactor chamber 5, a gas inlet 6, a gas outlet 7, and a gas flow controller 8. The light source here is a VUV excimer module that is situated at a distance 4 from mask 2. The space created by distance 4 may be filled with nitrogen N2 or some other inert gas that is permeable to VUV. A wafer W may be situated on adjustable wafer table 1 on an opposite side of mask 2. Wafer W includes a polymer coating P at a surface OW opposite from mask 2.

FIG. 1A shows the device during a first operating state, the exposure. For the exposure, wafer table 1 is adjusted with an exposure gap GE between wafer W and mask 2. The space created by exposure gap GE is purged with a gas mixture containing at least nitrogen N2 and/or oxygen O2. The total pressure, partial pressure, and mass flows of the gases may be controlled and regulated by mass flow and pressure controller 8.

FIG. 1B shows the device during a second operating state, the purging. For the purging of wafer surface WO, wafer table 1 may be adjusted with a purge gap GP between wafer W and mask 2, which in particular is larger than exposure gap GE. The space created by purge gap GP may be purged with a gas mixture.

Figure 2:
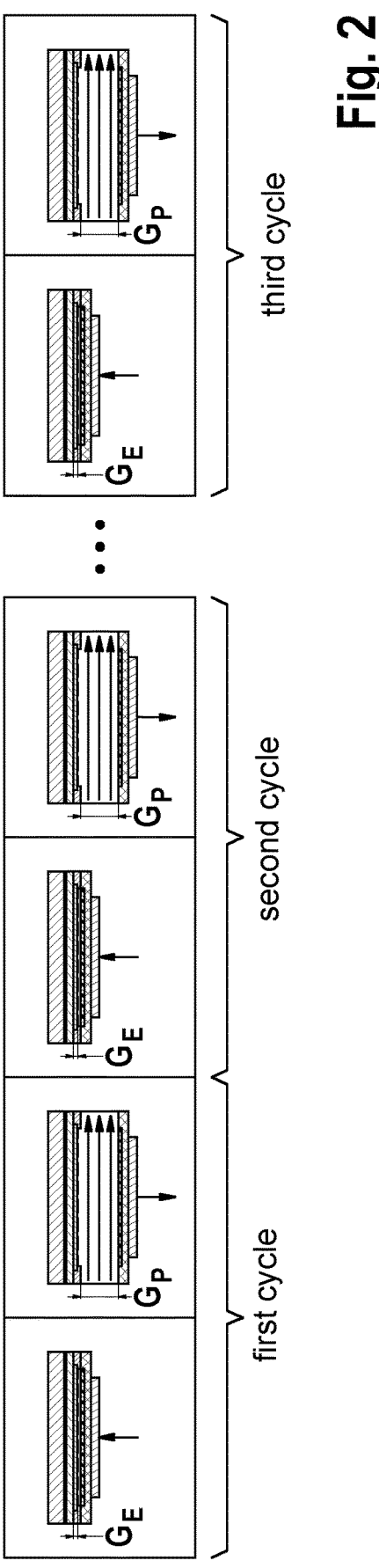
FIG. 2 shows the device according to an example embodiment of the present invention during alternating method steps of the method according to the present invention for locally removing and/or modifying a polymer material on a surface of a wafer.

FIG. 2 shows the device according to the present invention during alternating method steps of the method according to the present invention for locally removing and/or modifying a polymer material on a surface of a wafer. The method is carried out with N cycles, each cycle including a first step of exposure (left side of the diagram in each case) and a second step of purging (right side of the diagram in each case).

During the exposure, the device is adjusted and operated as described for FIG. 1A.

During the purging, the device is adjusted and operated as described for FIG. 1B.

Figure 3A:
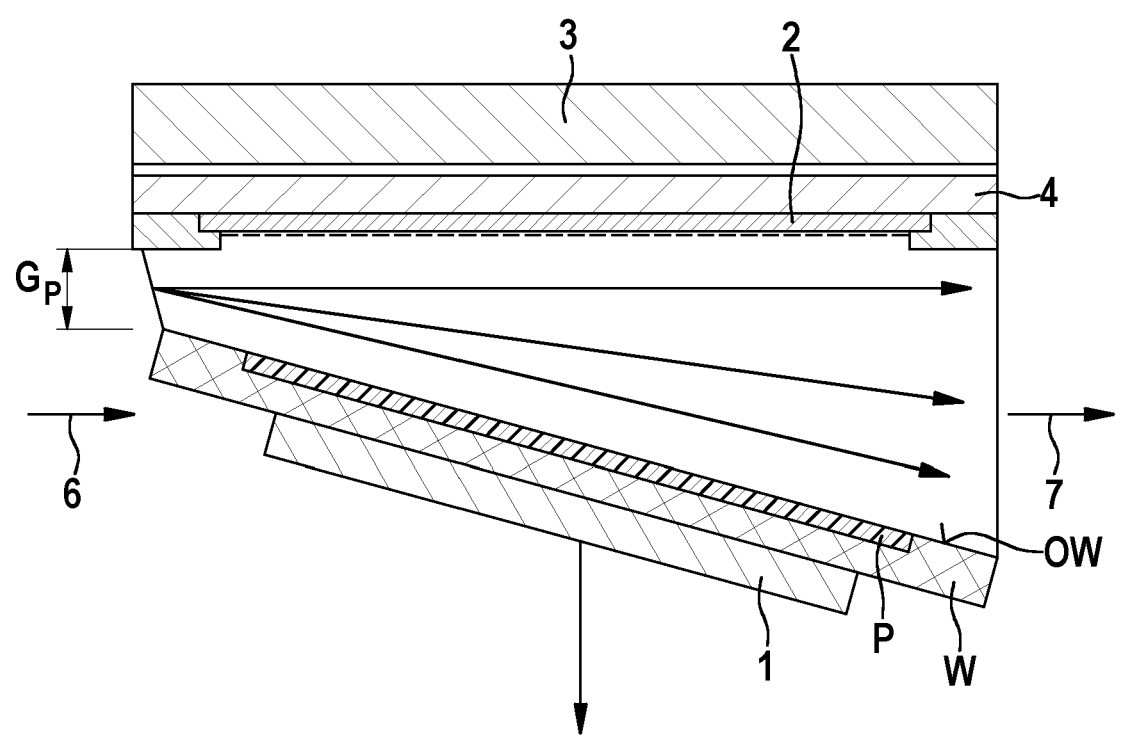
FIGS. 3A and 3B show one exemplary embodiment of the device according to the present invention in two embodiments of the method according to the present invention for locally removing and/or modifying a polymer material on a surface of a wafer.
Figure 3B:
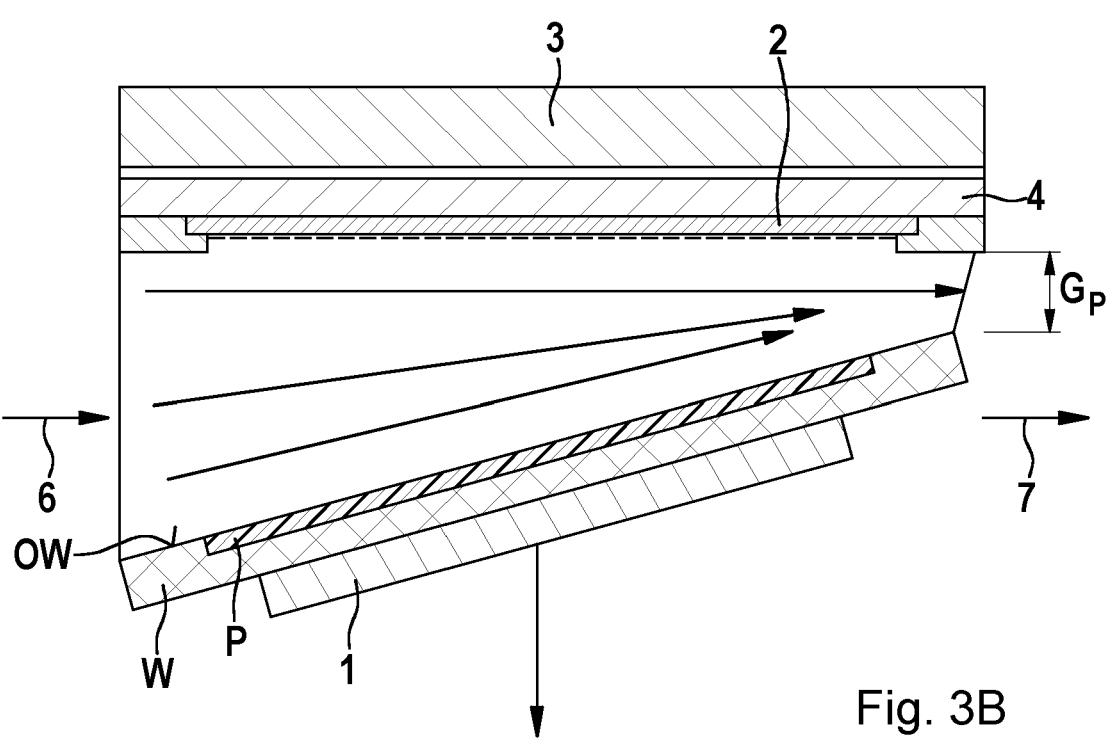

FIGS. 3A and 3B show one exemplary embodiment of the device according to the present invention in two embodiments of the method according to the present invention for locally removing and/or modifying a polymer material on a surface of a wafer. A detail of the device during the second operating state, the purging, is illustrated. FIGS. 3A and 3B show an adjustable wafer table 1 with a wafer W situated thereon, which with its surface WO points toward a mask 2. The gap between the wafer and the mask forms a space through which purge gas flows. A VUV light source 3 is situated at a distance 4 above mask 2. The space created by distance 4 is filled with nitrogen N2.

According to FIG. 3A, wafer 1 is tilted with respect to mask 2 in such a way that purge gap GP at the side of inlet 6 of the purge gas is smaller than at the side of outlet 7.

According to FIG. 3B, wafer 1 is tilted with respect to mask 2 in such a way that purge gap GP at the side of outlet 7 of the purge gas is smaller than at the side of inlet 6.

Figure 4:
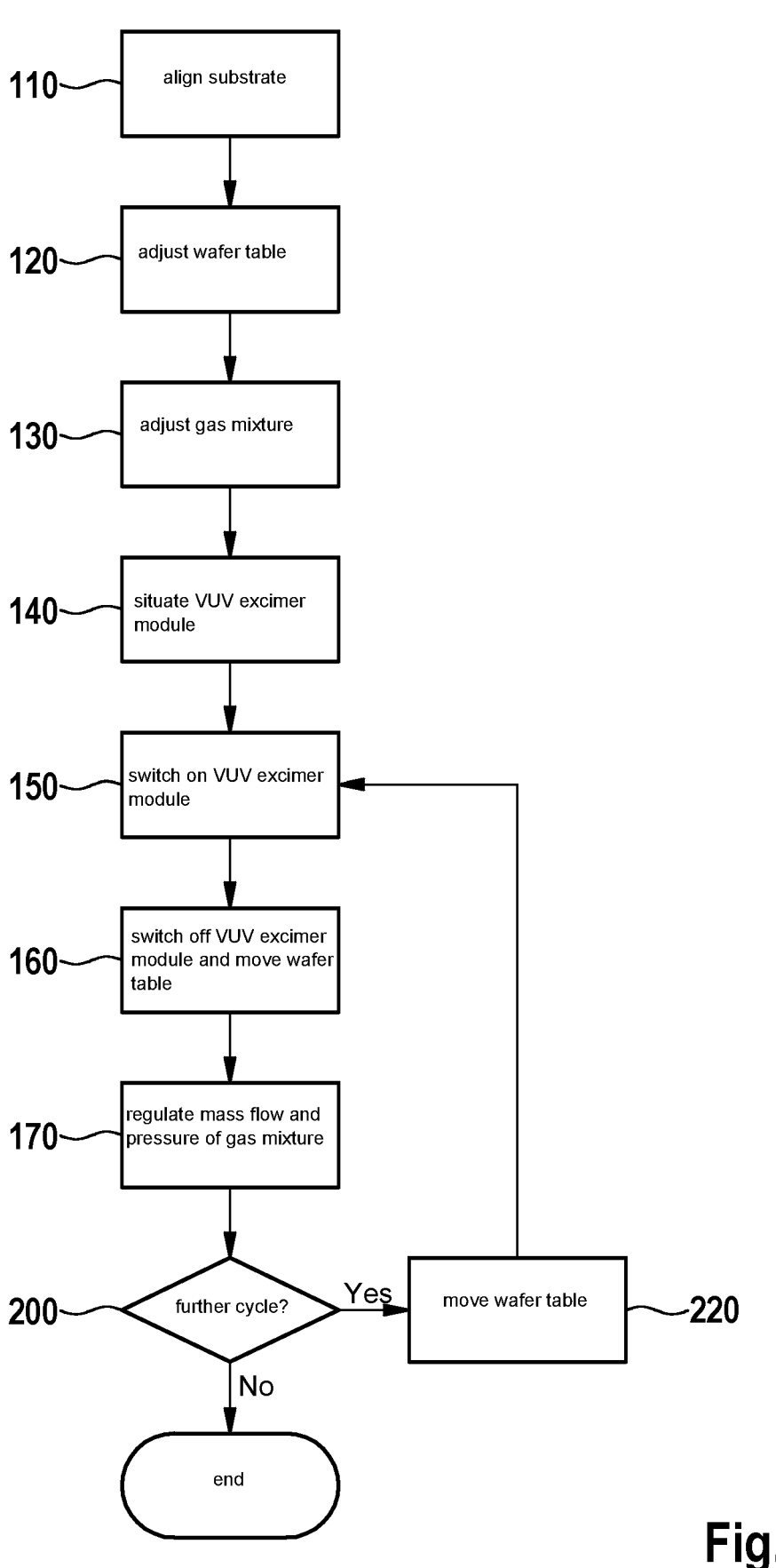
FIG. 4 schematically shows the method according to the present invention for locally removing and/or modifying a polymer material on a surface of a wafer in one exemplary embodiment.

FIG. 4 schematically shows the method according to the present invention for locally removing and/or modifying a polymer material on a surface of a wafer in one exemplary embodiment.

The illustrated method includes the steps:

110 aligning a substrate or wafer with respect to a photomask

120 adjusting a wafer table in the vertical direction into a position for exposure via an exposure gap GE between the mask and the wafer

130 adjusting a gas mixture with constant mass flow and pressure in the process chamber

140 situating a VUV excimer module at the top side of the process chamber, it being necessary to fill a distance between the VUV lamp and the photomask with nitrogen N2

150 switching on the VUV excimer module and exposing the substrate for an exposure time TE

160 switching off the VUV excimer module and immediately moving the wafer table in the vertical direction into the position for purging via a purge gap GP between the mask and the wafer

170 regulating the mass flow and pressure of the gas mixture in the process chamber and purging for a purging duration TP

200 decision: is a further process cycle necessary?

If "yes," then:

220 moving the wafer table in the vertical direction into the position for exposure via exposure gap GE between the mask and the wafer If "no," then:

end.

The local VUV cleaning process involves a VUV light source in the range of 172 nm, an adjustment mechanism, such as is used in photolithography, for positioning the wafer to be cleaned beneath a photomask, and a process chamber with its own gas inlets and gas outlets, a regulated mass flow of the process gas mixture, and a regulated gas pressure in the process chamber during the process steps of exposure and purging. The irradiation with light having a wavelength of 172 nm may break up the polymers or organic chain molecules. The regulated flow of the combined process gases such as nitrogen, oxygen, or also ozone may remove the reaction products from the surface thus treated, as the result of which a polymer-free surface is ultimately obtained.

To obtain a certain, reliable, uniform ASC layer thickness in unexposed areas over the entire substrate, the cleaning process is made up of a certain number of cycles. Each cycle includes a step of exposure, the wafer or the substrate being situated at a certain distance close to the photomask and the VUV lamp being switched on for a certain period of time. This is followed by a step of purging, in which the VUV lamp is switched off and the wafer or the substrate is further removed at a certain distance from the photomask, the process gas mixture flowing past the wafer surface for a certain period of time. This cycle of exposure and purging passes through a certain number of repetitions.

The irradiation of molecular oxygen $O_2$ with VUV light (172 nm) generates ozone ($O_3$) and oxygen radicals (O*). To achieve a homogeneous process, externally generated ozone may optionally be added to the process gas mixture.

The wafer is aligned with respect to the photomask in a first step so that it shades the surface areas to be protected, and the surface areas to be cleaned may be exposed. The polymer coating remains intact in the shaded areas, even after the cleaning process.

A gap GE between the mask and the wafer is set and a gas mixture containing nitrogen, oxygen, or also ozone is provided in a second step a) to ensure a gas flow in addition to a good local VUV exposure of the substrate with sufficient spatial resolution.

The VUV lamp is switched on and the exposure takes place for a certain exposure time (radiation dose) in a third step b). Exposure is carried out with local resolution. In the case of a MEMS device with an ASC, this means that only the bonding frame is exposed, but micromechanical functional elements remain shaded. The ASC on the micromechanical structures thus remains intact, while the ASC is locally removed from the bonding frame (FIGS. 1A and 1B).

The VUV lamp is switched off and a gap GP between the mask and the wafer is set in a fourth step c). A regulated pressure and gas flow are maintained in the chamber in order to transport away the reaction products of the removed polymer by the purging with the gas mixture (FIGS. 1A and 1B).

Lastly, the second, third, and fourth steps are carried out anew (d) with a certain number of repetitions in order to homogeneously clean the substrate or wafer W at all desired surfaces WO (FIG. 2). To improve the homogeneity of the process during the purging, the wafer may be positioned in parallel to photomask 2 with the aid of adjustable wafer table

1 (FIGS. 1, 2), or tilted at a certain angle with respect to photomask 2 and gas inlet 6 and gas outlet 7 (FIGS. 3A and 3B). In the next step of exposure, a parallel position of wafer W with respect to mask 2 with exposure gap GE is once again assumed, so that the mask and the wafer are always situated in parallel to one another during the VUV exposure.

LIST OF REFERENCE NUMERALS

W wafer
WO surface of the wafer
P polymer material
GE gap between the mask and the wafer during the exposure
TE exposure time
GP gap between the mask and the wafer during the purging
TP purging duration
1 adjustable wafer table
2 mask
3 VUV lamp
4 distance between the VUV lamp and the mask
5 hermetically sealed process chamber
6 inlet for the gas mixture
7 outlet for the gas mixture
8 mass flow and pressure controller
9 process gases

What is claimed is:

1. A method for locally removing and/or modifying a polymer material on a surface of a wafer, comprising the following steps:

a) aligning a mask with respect to the surface;

b) locally exposing the surface through the mask using a VUV light source while simultaneously supplying a gas mixture containing at least oxygen;

c) purging the surface with a gas mixture containing at least nitrogen and/or oxygen, the VUV light source being switched off;

d) repeating at least steps b) and c) until the removal and/or modification of the polymer material is complete.

2. The method for locally removing and/or modifying a polymer material as recited in claim 1, wherein the exposure is carried out in step b) with an exposure gap between the mask and the surface, and the purging is carried out in step c) with a purge gap between the mask and the surface, the purge gap being larger than the exposure gap.

3. The method for locally removing and/or modifying a polymer material as recited in claim 1, wherein externally generated ozone and/or an oxygen radical, is supplied to the gas mixture at least in step b) and/or c).

4. The method for locally removing and/or modifying a polymer material as recited in claim 1, wherein the wafer is in nonparallel alignment with respect to the mask in step c).

5. A device for locally removing and/or modifying a polymer material on a surface of a wafer, the device comprising:

a mask that is alignable with respect to the surface of the wafer;

a vacuum ultraviolet (VUV) light source situated above the mask and configured to locally expose the surface of the wafer through the mask;

a gas supply system configured to supply a gas mixture containing at least oxygen into a space between the wafer and the mask during exposure with the VUV light source;

a gas purge system configured to supply a gas mixture containing at least nitrogen and/or oxygen into the space between the wafer and the mask when the VUV light source is switched off;

an adjustable wafer table configured to hold the wafer and to move the wafer between:

a first operating state in which an exposure gap is set between the wafer and the mask during the exposure with the VUV light source, and a second operating state in which a purge gap, larger than the exposure gap, is set between the wafer and the mask during purging with the VUV light source switched off; and a control system configured to operate the device in repeated cycles of exposure and purging until the polymer material is removed and/or modified.

6. The device for locally removing and/or modifying a polymer material as recited in claim 5, wherein the adjustable wafer table is tiltable in such a way that the wafer is alignable with respect to the mask in a nonparallel manner.

7. The device for locally removing and/or modifying a polymer material as recited in claim 5, wherein the device includes a gas feed configured to supply externally generated ozone and/or an oxygen radical.

8. The device for locally removing and/or modifying a polymer material as recited in claim 5, further comprising a gas feed configured to supply externally generated ozone and/or an oxygen radical to the space between the wafer and the mask during at least the purging.

9. The device for locally removing and/or modifying a polymer material as recited in claim 5, wherein the adjustable wafer table is tiltable such that the wafer is alignable with respect to the mask in a nonparallel manner during purging.

10. The device for locally removing and/or modifying a polymer material as recited in claim 5, wherein the VUV light source comprises an excimer lamp configured to emit light at approximately 172 nm.

11. The device for locally removing and/or modifying a polymer material as recited in claim 5, further comprising a hermetically sealed process chamber enclosing the wafer table, mask, and gas inlets/outlets.

12. The device for locally removing and/or modifying a polymer material as recited in claim 5, wherein the control system is further configured to regulate gas flow rates and chamber pressure during the exposure and purging steps.

* * * * *